United States Patent
Zhan et al.

(10) Patent No.: US 10,496,202 B2
(45) Date of Patent: Dec. 3, 2019

(54) IN-CELL TOUCH PANEL, MANUFACTURING METHOD THEREOF AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Xiaozhou Zhan, Beijing (CN); Jian Sun, Beijing (CN); Cheng Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/571,724

(22) PCT Filed: Jun. 15, 2017

(86) PCT No.: PCT/CN2017/088443
§ 371 (c)(1),
(2) Date: Nov. 3, 2017

(87) PCT Pub. No.: WO2018/001103
PCT Pub. Date: Jan. 4, 2018

(65) Prior Publication Data
US 2018/0260058 A1    Sep. 13, 2018

(30) Foreign Application Priority Data
Jun. 28, 2016   (CN) .......................... 2016 1 0493669

(51) Int. Cl.
*G06F 3/044*    (2006.01)
*G06F 3/041*    (2006.01)
(Continued)

(52) U.S. Cl.
CPC .......... *G06F 3/0412* (2013.01); *G02F 1/1368* (2013.01); *G02F 1/13338* (2013.01);
(Continued)

(58) Field of Classification Search
CPC ........ G06F 3/0412; G06F 3/041; G06F 3/044; G06F 3/047; G02F 1/13338;
(Continued)

(56) References Cited

U.S. PATENT DOCUMENTS 9,543,443 B2    1/2017  Sun et al.
2003/0117059 A1*  6/2003  Koo .................. H01L 27/3265
                                                      313/422
(Continued)

FOREIGN PATENT DOCUMENTS

CN    103383946 A    11/2013
CN    104332477 A    2/2015
(Continued)

OTHER PUBLICATIONS

International Search Report and Written Opinnion dated Aug. 2, 2017; PCT/CN2017/088443.
(Continued)

*Primary Examiner* — Towfiq Elahi (57) ABSTRACT

An in-cell touch panel, a manufacturing method thereof and a display device are provided. The in-cell touch panel includes a base substrate, and a signal line, a touch electrode and a touch line which are provided on the base substrate, the touch line being electrically connected with the touch electrode, wherein the touch line and the signal line extend along a same direction, and the touch line is at least partially (Continued)

overlapped with the signal line in a direction perpendicular to the base substrate. The in-cell touch panel, the manufacturing method thereof and the display device are configured to solve a problem of low pixel aperture ratio.

18 Claims, 7 Drawing Sheets

(51) Int. Cl.
    *G02F 1/1333*     (2006.01)
    *G02F 1/1335*     (2006.01)
    *G02F 1/1343*     (2006.01)
    *G02F 1/1368*     (2006.01)
    *G06F 3/047*     (2006.01)
    *H01L 27/12*     (2006.01)
    *G02F 1/1337*     (2006.01)

(52) U.S. Cl.
    CPC .. *G02F 1/133512* (2013.01); *G02F 1/134309* (2013.01); *G06F 3/044* (2013.01); *G06F 3/047* (2013.01); *H01L 27/124* (2013.01); *G02F 1/133707* (2013.01); *G02F 2201/121* (2013.01); *G02F 2201/123* (2013.01); *G06F 2203/04103* (2013.01)

(58) Field of Classification Search
    CPC ......... G02F 1/133512; G02F 1/134309; G02F 1/1368; H01L 27/124
    See application file for complete search history.

(56) References Cited

U.S. PATENT DOCUMENTS

| | | | |
|---|---|---|---|
| 2014/0145310 A1* | 5/2014 | Akiyama | H01L 27/1266 257/618 |
| 2015/0185903 A1 | 7/2015 | Park | |
| 2016/0187694 A1* | 6/2016 | Kim | G06F 3/0412 349/12 |
| 2016/0246399 A1 | 8/2016 | Huang et al. | |
| 2016/0299612 A1* | 10/2016 | Lu | G06F 3/0412 |
| 2017/0038887 A1 | 2/2017 | Zhang et al. | |
| 2017/0092658 A1 | 3/2017 | Sun et al. | |
| 2017/0110685 A1* | 4/2017 | Lee | H01L 51/5253 |
| 2017/0177143 A1 | 6/2017 | Ding et al. | |
| 2017/0177159 A1 | 6/2017 | Cao et al. | |

FOREIGN PATENT DOCUMENTS

| | | |
|---|---|---|
| CN | 104407757 A | 3/2015 |
| CN | 104657024 A | 5/2015 |
| CN | 104777933 A | 7/2015 |
| CN | 104915062 A | 9/2015 |
| CN | 104991690 A | 10/2015 |
| CN | 105487719 A | 4/2016 |
| CN | 105572935 A | 5/2016 |
| CN | 106168865 A | 11/2016 |

OTHER PUBLICATIONS

The First Chinese Office Action dated Jun. 29, 2018; Appln. No. 201610493669.8.

* cited by examiner

IN-CELL TOUCH PANEL, MANUFACTURING METHOD THEREOF AND DISPLAY DEVICE

At least one of embodiments of the present disclosure relates to an in-cell touch panel, a manufacturing method thereof and a display device.

BACKGROUND

With rapid developments of display technique, touch panels have spread throughout people's daily life gradually. Generally, according to compositions and structures, touch panels can be divided into following modes: add on mode touch panels, on cell touch panels and in-cell touch panels. An add on mode touch panel is a liquid crystal display (LCD) with touch function which is formed by manufacturing a touch panel and a liquid crystal display separately and attaching the touch panel to the liquid crystal display. The add on mode touch panel has disadvantages, such as high manufacturing cost, low light transmittance, thick module etc. And in an in-cell touch panel, the touch electrode units of the touch panel are provided inside the liquid crystal display, which not only reduces an entire thickness of the module, but also reduces manufacturing cost of the touch panel greatly. Accordingly, the in-cell touch panel is popular to various major manufactures of panels.

In-cell touch panels generally employ principles of mutual-capacitance or self-capacitance to detect touch positions of fingers of a user. Principle of self-capacitance is to provide a plurality of electrode units in a touch layer, the electrode units are independent and insulated from each other and correspond to touch blocks, When human body does not touch the touch panel, capacitance which respective capacitance electrodes bears is a fixed value. When the human body touches the touch panel, it corresponds to connect a self-capacitor relative to ground to an electrode block in parallel, and a touch detection chip can detect change of capacitance value of a respective electrode block to decide a position touched by the human body.

SUMMARY

At least one of embodiments of the disclosure relates to an in-cell touch panel, a manufacturing method thereof and a display device, to solve a problem of low aperture ratio of a pixel.

At least one embodiment of the disclosure provides an in-cell touch panel, comprising a base substrate, and a signal line, a touch electrode and a touch line which are provided on the base substrate, the touch line being electrically connected with the touch electrode, wherein the touch line and the signal line extend along a same direction, and the touch line is at least partially overlapped with the signal line in a direction perpendicular to the base substrate.

At least one embodiment of the disclosure provides a manufacturing method of an in-cell touch panel, comprising: forming a pattern of a data line, a source electrode and a light shielding layer on a base substrate by one time patterning process; forming a first insulation layer on the pattern of the data line, the source electrode and the light shielding layer; forming a pattern of an active layer on the first insulation layer, the active layer being electrically connected with the source electrode by a first insulation layer via hole; forming a second insulation layer on the pattern of the active layer; forming a pattern of a gate electrode and a gate line on the second insulation layer by one time patterning process; forming a third insulation layer on the pattern of the gate electrode and the gate line; forming a pattern of a touch line and a drain electrode on the third insulation layer by one time patterning process, the drain electrode being electrically connected with the active layer by a second insulation layer via hole; forming a fourth insulation layer on the pattern of the touch line and the drain electrode; and forming a pattern of a touch electrode on the fourth insulation layer, the touch electrode being electrically connected with the touch line by a third insulation layer via hole; wherein, the touch line and the data line extend along a same direction, and the touch line is at least partially overlapped with the data line in a direction perpendicular to the base substrate, or the touch line and the gate line extend along a same direction, and the touch line is at least partially overlapped with the gate line in a direction perpendicular to the base substrate.

At least one embodiment of the disclosure provides a display device, comprising any one of the above mentioned in-cell touch panels.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In structure design of the above mentioned self capacitance in-cell touch panel, different manufacturers have different solutions, generally including solutions of adding a touch layer or dual source. In the solution of adding a touch layer to transport signals from the touch electrode block, the key point is to adjust process of connecting between different metal layers. Thus, in process, deposition process of passivation film is generally required to be added, in addition to adding a mask for forming the touch layer. The solution of dual source is to add metal wirings (touch lines) in a same layer as a source electrode in a pixel region as conductive lines of touch signals. For example, touch lines are introduced additionally, which requires a width of a black matrix in a corresponding position to be increased, so that loss of the aperture ratio is large, although no process is needed to be added. Therefore, for products with higher and higher resolution, product application is limited greatly.

Accordingly, in design of an in-cell touch panel structure, how to decrease a thickness of a touch substrate, reduce process difficulty and improve optical effect quality is an important technical problem urgent to be solved.

Figure 1:
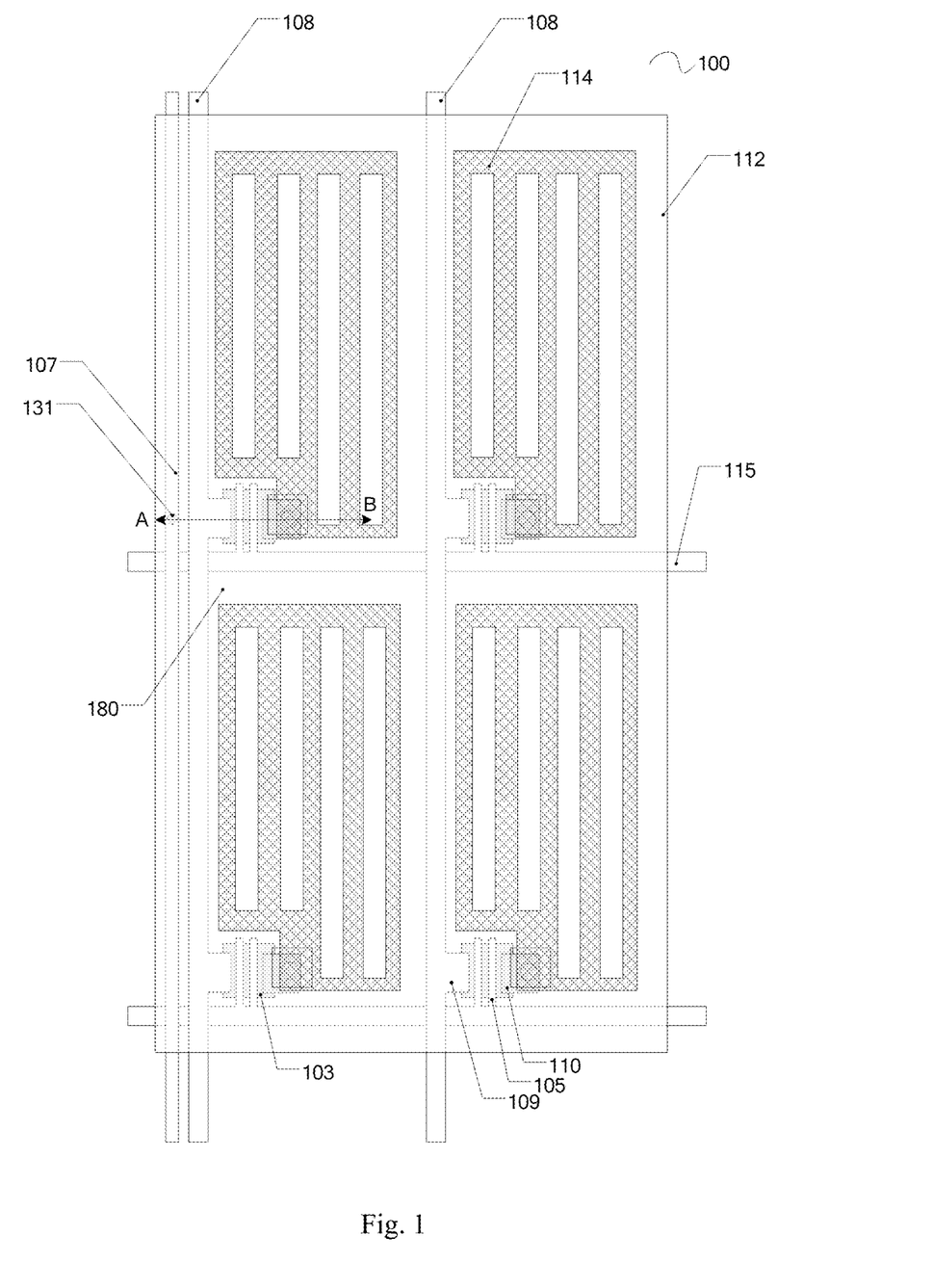
FIG. 1 is a top schematic view of an in-cell touch panel.
Figure 2:
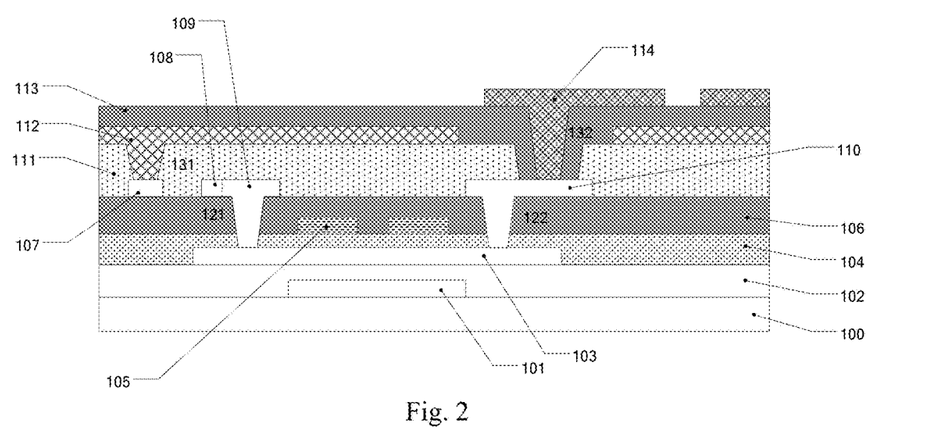
FIG. 2 is a cross-sectional view along line AB in FIG. 1.

FIG. 1 illustrates an in-cell touch panel, and FIG. 2 is a cross-sectional diagram along line AB in FIG. 1. As illustrated in FIGS. 1 and 2, a light shielding layer (LS layer) 101 is provided on a base substrate 100; a first insulation layer 102 is provided on the light shielding layer 101; an active layer 103 is provided on the first insulation layer 102; a second insulation layer 104 is provided on the active layer 103; a gate electrode 105 is provided on the second insulation layer 104; a third insulation layer 106 is provided on the gate electrode 105; a touch line 107, a data line 108, a source electrode 109 and a drain electrode 110 are provided on the third insulation layer 106; the source electrode 109 and the drain electrode 110 are electrically connected with the active layer 103 by a via hole 121 and a via hole 122 respectively; a fourth insulation layer 111 is provided on the touch line 107, the data line 108, the source electrode 109 and the drain electrode 110; a touch electrode 112 is provided on the fourth insulation layer 111; the touch electrode 112 are electrically connected with the touch line 107 by an insulation layer via hole 131; a fifth insulation layer 113 is provided on the touch electrode 112; a pixel electrode 114 is provided on the fifth insulation layer 113; and the pixel electrode 114 is electrically connected with the drain electrode 110 by an insulation layer via hole 132.

It can be seen from FIG. 1, the base substrate 100 includes a plurality of gate lines 115 and a plurality of data lines 108 (the numbers of the gate lines 115 and the data lines 108 are not limited as illustrated in figures). The gate lines and the data lines are intersected and insulated from each other to define a plurality of sub-pixels 180. A touch electrode 112 can correspond to a sub-pixel or a multiple sub-pixels. In FIG. 1, an example in which a touch electrode 112 corresponds to four sub-pixels is detailed for illustration, but it is not limited to this.

It can be seen from FIGS. 1 and 2, the existing of the touch line 107 makes the loss of the aperture ratio relatively large.

Figure 3:
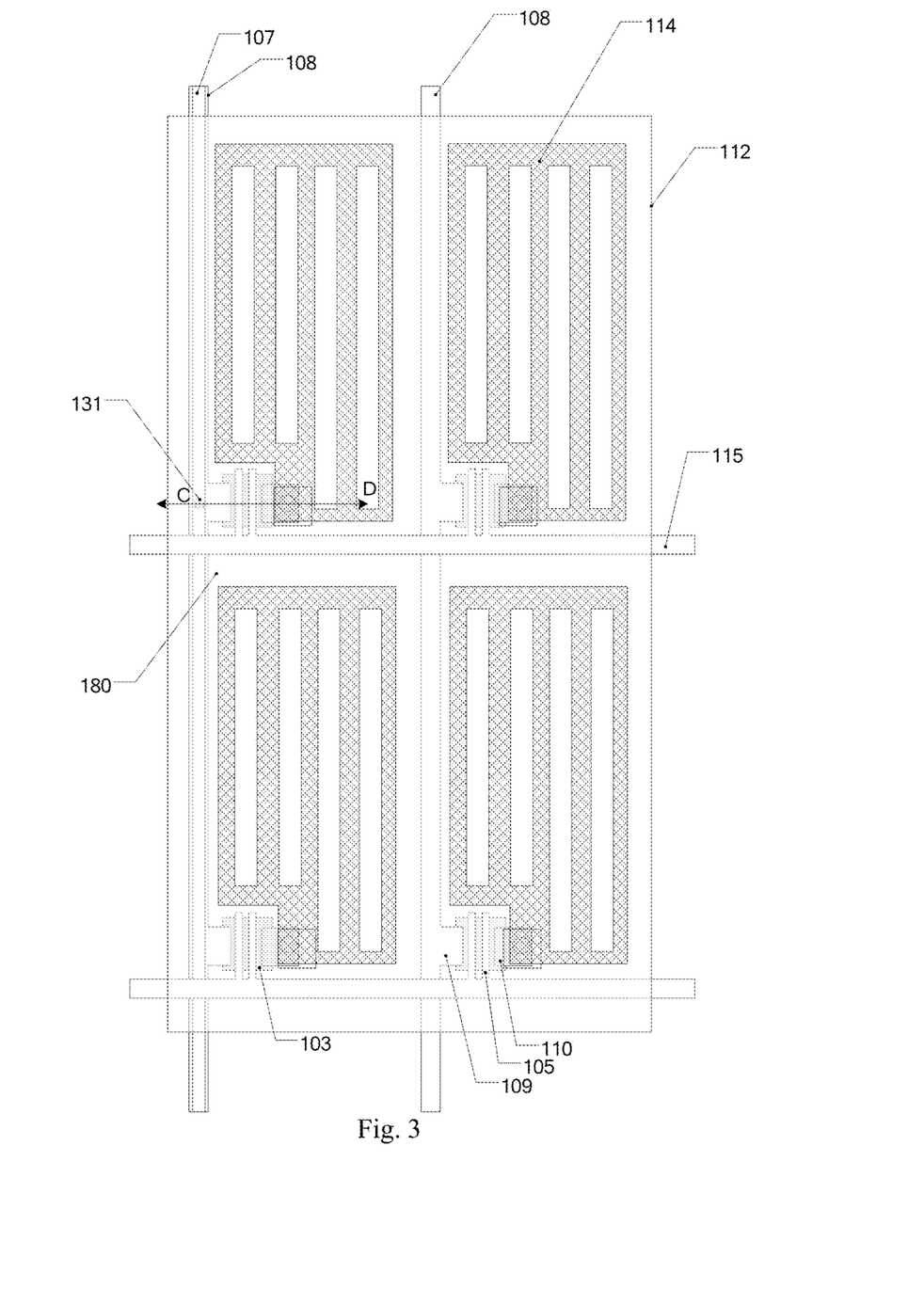
FIG. 3 is a top schematic view of an in-cell touch panel provided by an embodiment of the disclosure.
Figure 4:
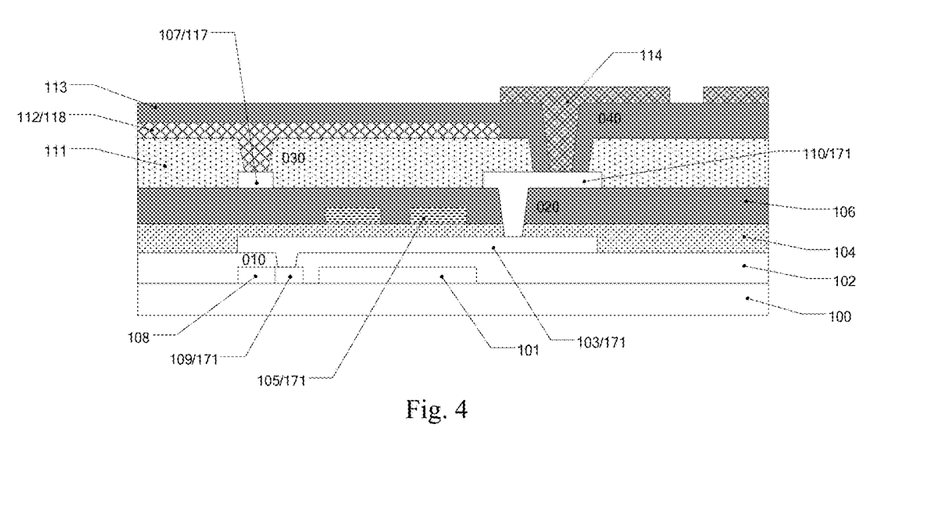
FIG. 4 is a cross-sectional schematic view along line CD in FIG. 3.

As illustrated in FIGS. 3 and 4, at least one embodiment of the disclosure provides an in-cell touch panel, including a base substrate 100; and a signal line, a touch electrode 112 and a touch line 107 which are provided on the base substrate 100, the touch line 107 is electrically connected with the touch electrode 112. The touch line 107 and the signal line extend along a same direction, and the touch line 107 is at least partially overlapped with the signal line in a direction perpendicular to the base substrate 100.

Because the touch line 107 is at least partially overlapped with the signal line in the direction perpendicular to the base substrate, a width of a black matrix provided at a position where the touch line 107 is located can be reduced, and loss of the aperture ratio of a pixel can be decreased or eliminated.

It should be noted that, at least partially overlapped refers to the touch line 107 and the signal line having an overlap portion in the direction perpendicular to the base substrate 100, for example. In addition to the overlap portion, it is not excluded that they have non-overlap portions, and embodiments of the disclosure are not limited to this. For example, an orthogonal projection of the touch line 107 on the base substrate 100 and an orthogonal projection of the signal line on the base substrate 100 have an overlap portion.

It can be seen from FIG. 3 that, the base substrate 100 includes a plurality of gate lines 115 and a plurality of data lines 108, and the plurality of gate lines and the plurality of data lines are intersected and insulated from each other to define a plurality of sub-pixels 180. For example, as illustrated in FIG. 3, a touch electrode 112 can correspond to a sub-pixel or multiple sub-pixels. In FIG. 3, an example in which a touch electrode 112 corresponds to four sub-pixels is detailed for illustration, and it should be noted that, embodiments of the disclosure are not limited to this.

It should be noted that, sub-pixels 180 can be defined by the plurality of gate lines 115 and the plurality of data lines 108, but it is not limited to this. For example, a sub-pixel 180 includes a gate line 115, a data line 108, a pixel electrode and a switch element (the switch element includes a thin film transistor 171, for example). The sub-pixel 180 is a minimum unit to display of an array substrate. For example, the gate line is configured to provide switch-on or switch-off signals to the thin film transistor. In the liquid crystal touch panel, the data line can be configured to provide data signals to the pixel electrode, an electric field can be formed between the pixel electrode and the common electrode, and the rotating degree of liquid crystal molecules can be controlled by controlling the electric field, and gray display is achieved.

For example, the signal line includes the data line 108 or the gate line 115. In FIGS. 3 and 4, an example in which the signal line is the data line 108 is detailed for illustration.

For example, the touch line 107 is entirely overlapped with the signal line in the direction perpendicular to the base substrate 100. Thus, reduction of aperture ratio due to providing the touch line 107 can be avoided, so that the touch panel can have maximum aperture ratio. It should be noted that, entirely overlapped refers to an orthogonal projection of one of the touch line 107 and the signal line on the base substrate 100 falls within (is smaller or equal to) an orthogonal projection of the other on the base substrate 100. For example, the orthogonal projection of the touch line 107 on the base substrate 100 covers the orthogonal projection of the signal line on the base substrate 100, and alternatively, the orthogonal projection of the signal line on the base substrate 100 covers the orthogonal projection of the touch line 107 on the base substrate 100. For example, the touch line 107 and the signal line correspond in position, and have same widths, and alternatively, the touch line 107 and the data line correspond in position, and the width of one of them is smaller than that of the other of them.

For example, the signal line is electrically insulated from the touch electrode 112, and the signal line is electrically insulated from the touch line 107.

For example, as illustrated in FIGS. 3 and 4, the in-cell touch panel further includes a thin film transistor 171. The thin film transistor 171 includes an active layer 103, a source electrode 109 and a drain electrode 110, the source electrode 109 is electrically connected with the data line 108, the source electrode 109 and the drain electrode 110 are electrically connected with the active layer 103 respectively, the source electrode 109 is closer to the base substrate 100 than the active layer 103 (the source electrode 109 is provided between the active layer 103 and the base substrate 100), and the active layer 103 is closer to the base substrate 100 than the drain electrode 110 (the active layer 103 is provided between the drain electrode 110 and the base substrate 100). It provides an implementation to make the touch line 107 is at least partially overlapped with the signal line in the direction perpendicular to the base substrate 100, by adjusting positions of the data line 108 and the source electrode 109.

For example, as illustrated in FIG. 4, the source electrode 109 and the data line 108 are formed in a same layer, and the touch line 107 and the drain electrode 110 are formed in a same layer. Accordingly, a process can be saved. For example, the source electrode 109 and the data line 108 are electrically connected with each other, and can be formed integrally. The touch line 107 and the drain electrode are insulated from each other.

For example, as illustrated in FIG. 4, the thin film transistor 171 further includes a gate electrode 105. The gate line 115 is electrically connected with the gate electrode 105, the gate line 115 and the gate electrode 105 can be formed in a same layer, and the active layer 103 is closer to the base substrate 100 than the gate electrode 105 (the active layer 103 is provided between the gate electrode 105 and the base substrate 100). Accordingly, a process can be saved. The thin film transistor 171 illustrated in FIG. 4 is the thin film transistor 171 of top-gate structure. For example, the gate line 115 and the gate electrode 105 can be formed integrally.

In the embodiment of the disclosure, formed integrally refers to combining into one body structure. A conductive component which is formed into one body structure in a same layer is in status of electrical connection. The components formed in a same layer can be electrically connected with each other or can be insulated from each other, which is designed as required.

For example, as illustrated in FIG. 4, the in-cell touch panel further includes a light shielding layer 101. The light shielding layer is closer to the base substrate 100 than the active layer 103 (the light shielding layer 101 is provided between the active layer 103 and the base substrate 100), and the data line 108, the source electrode 109 and the light shielding layer 101 are formed in a same layer. Therefore, a process can be saved. The light shielding layer 101 is configured to shield light, and can protect the active layer 103 of the thin film transistor 171. For example, the light shielding layer 101 and the source electrode 109 are insulated from each other, and the light shielding layer 101 and the data line 108 are insulated from each other.

For example, as illustrated in FIG. 4, the in-cell touch panel further includes a pixel electrode 114, and the pixel electrode 114 is electrically connected with the drain electrode by a fourth insulation layer via hole 040.

For example, as illustrated in FIG. 4, the touch electrode 112 can be multiplexed as a common electrode 118, and the touch line 107 can be multiplexed as a common electrode line 117.

Figure 5:
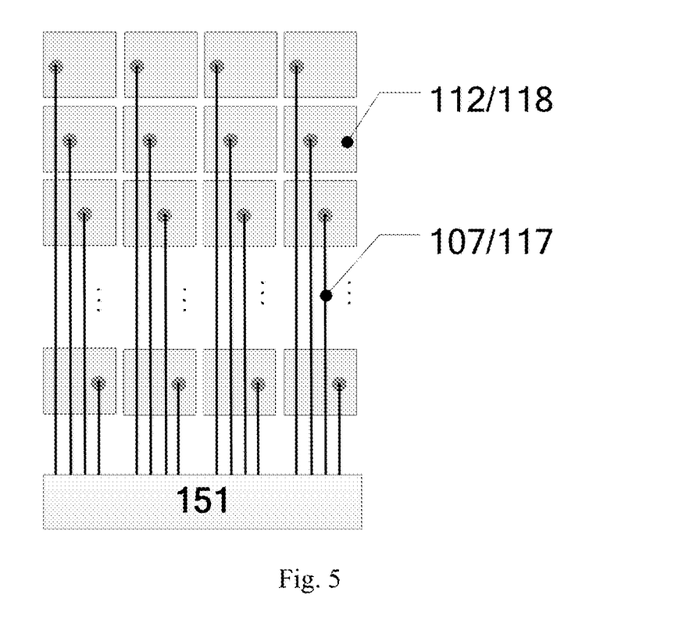
FIG. 5 is a top schematic view of touch electrodes, touch lines and a touch detection chip of an in-cell touch panel provided by an embodiment of the disclosure.

As illustrated in FIGS. 3, 4 and 5, the signal line can be the data line 108. That is, the touch line 107 and the data line 108 extend along a same direction, and the touch line 107 is at least partially overlapped with the data line 108 in the direction perpendicular to the base substrate 100. FIG. 5 illustrates that a plurality of touch electrodes 112 (self-capacitance electrodes) which are independent (self-capacitance electrodes are not electrically connected with each other). Each of the touch electrodes 112 (self-capacitance electrodes) can be connected with the touch detection chip 151 by one touch line 107. For example, the touch electrode 112 can be designed to a square electrode in about 5 mm×5 mm (self-capacitance electrode, not limited to the given numeric value in size), the touch electrode 112 is connected with the touch detection chip 151 by a conduction line (the touch line 107), a drive signal Tx is applied to the touch electrode 112 by the touch detection chip, and the touch electrode 112 can receive feedback signals itself. Because a finger for operation touches the touch panel in a direct couple manner, during operation, touch change due to the finger will be large.

It should be noted that, all of touch lines 107 of the respective touch electrodes 112 illustrated in FIG. 5 can be at least partially overlapped with the data lines 108 at corresponding positions respectively, and touch lines 107 which are not overlapped with the data line can also be provided. This is not limited by embodiments of the disclosure.

In FIG. 5, an example in which the touch line 107 and the data line 108 extend along a same direction and the touch line 107 is at least partially overlapped with the data line 108 in the direction perpendicular to the base substrate, is detailed for illustration. It should be noted that, the touch line 107 and the gate line 115 extend in a same direction, and the touch line 107 is at least partially overlapped with the gate line 115 in the direction perpendicular to the base substrate, in some other embodiments (not illustrated in figures), in some other embodiments. For example, the gate line 115 and the touch line 107 extend in a first direction, the data line 108 extends along a second direction, and the first direction is perpendicular to the second direction. The first direction can, for example, be a horizontal direction in a plane of paper, and the second direction can, for example, be a direction perpendicular to the plane of paper.

Figure 6:
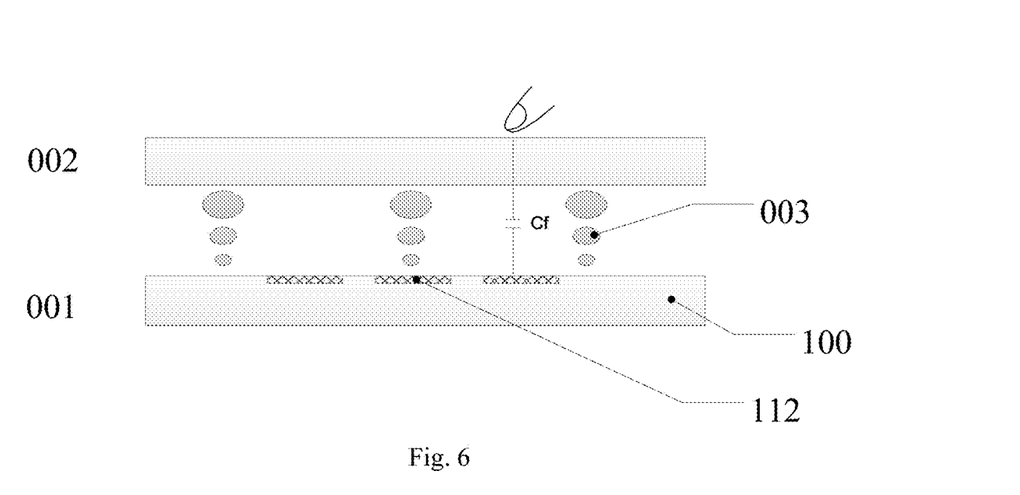
FIG. 6 is a touch principle schematic diagram of an in-cell touch panel provided by an embodiment of the disclosure.

As illustrated in FIG. 6, the in-cell touch panel includes an array substrate 001 and an opposing substrate opposite to the array substrate 001. The array substrate 001 and the opposing substrate 002 can be two substrates, an upper substrate and a lower substrate of the display panel. Liquid crystal 003 is provided between the array substrate 001 and the opposing substrate 002, and the touch electrode 112 is provided on the array substrate 001. The liquid crystal display panel can adopt advanced-super dimensional switching (ADS) mode, vertical alignment (AV) mode or twisted nematic (TN)

mode. The mode of the liquid crystal display panel in embodiments of the disclosure is not limited to this. For example, if the touch electrode 112 is multiplexed as the common electrode 118, the in-cell touch panel is an ADS mode, the pixel electrode can be slit electrodes, the common electrode can be a plate-shaped electrode, and they are not limited to this. If the touch electrode 112 is not multiplexed as the common electrode 118, the common electrode can be provided on the opposing substrate 002 and the in-cell touch panel can be a VA mode or a TN mode. When the touch panel is not touched, respective touch electrodes 112 have capacitance in static balance status relative to ground. When a finger touches a surface of the panel, a capacitance Cf relative to ground will be connected in parallel on the surface of the touch electrode 112, to result in changing of a self-capacitance in original balance status. A touch point position can be determined according to detected change of self-capacitance of the touch electrode 112, to implement multi-touch.

Figure 7:
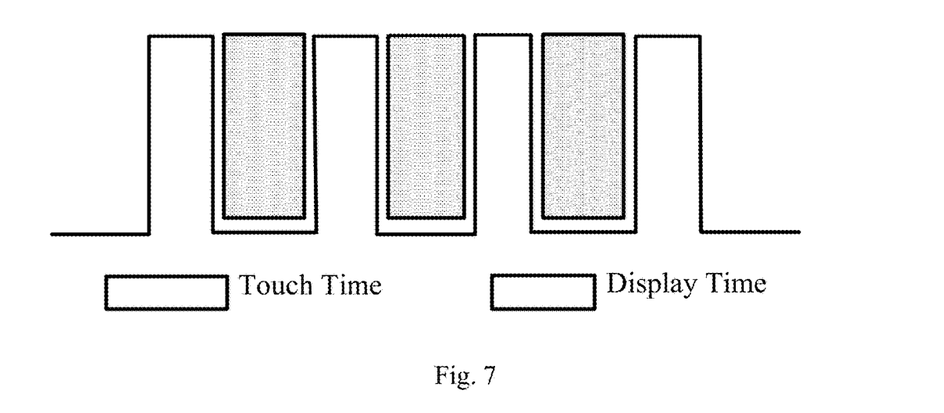
FIG. 7 is a time-division drive schematic diagram of an in-cell touch panel provided by an embodiment of the disclosure.

As illustrated in FIG. 7, if the touch electrode 112 (taking self-capacitance electrode as an example) is multiplexed as the common electrode 118, the respective touch electrode 112 is connected with the touch line 107 to be multiplexed as the common electrode 118, and touch and display are implemented by adopting time-division drive manner. For example, time for the touch panel displaying a frame is divided into display time and touch time. In display time, a common electrode signal is loaded to the touch line 107 connected with the respective self-capacitance electrode in the touch panel by the touch detection chip, and a scan signal can be loaded by using the gate line, and a gray signal is loaded by using the data line 108 formed in a same layer as the LS layer, to implement display function. In touch time, the touch detection chip is configured to apply a drive signal to the touch line 107 connected with the respective self-capacitance electrode, and receive feedback signals of the respective self-capacitance electrode at the same time, and decide whether touch occurs by analyzing the feedback signals, to implement touch function. The touch detection chip can also be integrated with a drive IC. During display time of one frame, the display times and the touch times are performed alternately, distribution of particular times is determined by touch scan frequency and process capacity of the IC chip and this is not particularly defined herein.

Figure 8:
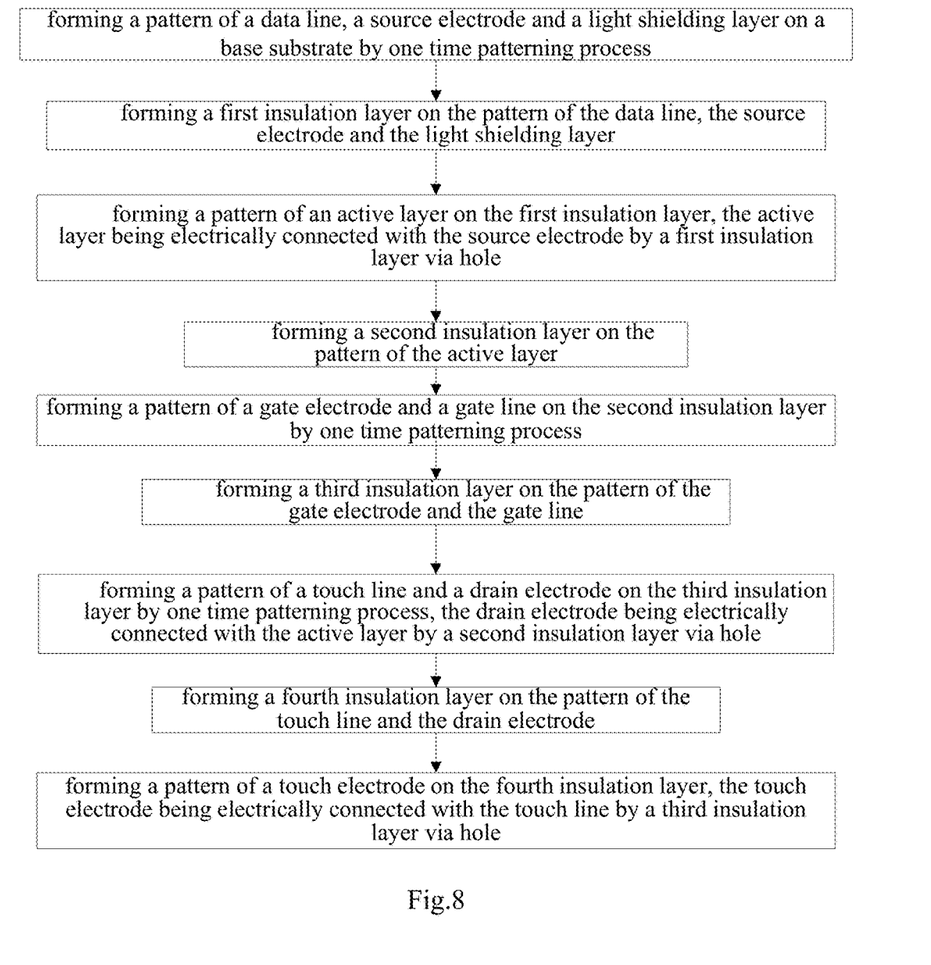
FIG. 8 is a flow chart of a manufacturing method of an in-cell touch panel provided by an embodiment of the disclosure.

As illustrated in FIG. 8, at least one embodiment of the disclosure further provides a manufacturing method of an in-cell touch panel, including: forming a pattern of a data line 108, a source electrode 109 and a light shielding layer 101 on a base substrate 100 by one time patterning process; forming a first insulation layer 102 on the pattern of the data line 108, the source electrode 109 and the light shielding layer 101; forming a pattern of an active layer 103 on the first insulation layer 102, the active layer 103 being electrically connected with the source electrode 103 by a first insulation layer via hole 010; forming a second insulation layer 104 on the pattern of the active layer 103; forming a pattern of the gate electrode 105 and the gate line 115 on the second insulation layer 104 by one time patterning process; forming a third insulation layer 106 on the pattern of the gate electrode 105 and the gate line 115; forming a pattern of a touch line 107 and a drain electrode 110 on the third insulation layer 106 by one time patterning process, the source electrode 110 being electrically connected with the active layer 103 by a second insulation layer via hole 020; for example, the second insulation layer via hole 020 passing through the third insulation layer 106 and the second insulation layer 104; forming a fourth insulation layer 111 on the pattern of the touch line 107 and the drain electrode 110; forming a pattern of a touch electrode 112 on the fourth insulation layer 111, the touch electrode 112 being electrically connected with the touch line 107 by a third insulation layer via hole 030; wherein, the touch line 107 and the data line 108 extend along a same direction, and the touch line 107 is at least partially overlapped with the data line 108 in a direction perpendicular to the base substrate 100; alternatively, the touch line 107 and the gate line 115 extend along a same direction, and the touch line 107 is at least partially overlapped with the gate line 115 in a direction perpendicular to the base substrate 100.

At least one embodiment of the disclosure provides a manufacturing method of an in-cell touch panel, which is simple.

For example, in the manufacturing method of the in-cell touch panel, the touch line 107 is entirely overlapped with the data line 108 in the direction perpendicular to the base substrate; alternatively, the touch line 107 is entirely overlapped with the gate line 115 in the direction perpendicular to the base substrate.

For example, the manufacturing method of the in-cell touch panel further includes forming a fifth insulation layer 113 on the pattern of the touch electrode 112, and forming a pattern of a pixel electrode 114 on the fifth insulation layer 113, wherein the pixel electrode 114 is electrically connected with the drain electrode 110 by a fourth insulation layer via hole 040. For example, the fourth insulation layer via hole 010 passes through the fifth insulation layer 113 and the fourth insulation layer 111.

For example, in order to save manufacturing process, in the manufacturing method of the in-cell touch panel, the touch electrode 112 can be multiplexed as the common electrode 118, and the touch line 107 is multiplexed as the common electrode line 117.

In embodiments of the disclosure, insulation layer via holes which pass through a plurality of insulation layers can be formed by etching different insulation layers by one time patterning process, and they also can be formed by etching the insulation layer which is finally formed on basis of the previously formed pattern of the insulation layer (one time etching). This is not limited by the embodiments of the disclosure.

One embodiment of the disclosure provides a manufacturing method of an in-cell touch panel, including: forming a pattern of a data line 108, a source electrode 109 and a light shielding layer 101 on a base substrate 100 by one time patterning process; forming a first insulation layer 102 on the pattern of the data line 108, the source electrode 109 and the light shielding layer 101, and patterning the first insulation layer 102 to form a first insulation pattern; forming a pattern of an active layer 103 on the first insulation pattern; forming a second insulation layer 104 on the pattern of the active layer 103; forming a pattern of a gate electrode 105 and a gate line 115 on the second insulation layer 104 by one time patterning process; forming a third insulation layer 106 on the pattern of the gate electrode 105 and the gate line 115, and patterning the third insulation layer 106 and the second insulation layer 104, to form a second insulation pattern and a third insulation pattern; forming a pattern of a touch line 107 and a drain electrode 110 on the third insulation pattern by one time patterning process; forming a fourth insulation layer 111 on the pattern of the touch line 107 and the drain electrode 110, and patterning the fourth insulation layer 111 to form a fourth insulation pattern; forming a pattern of a touch electrode 112 on the fourth insulation layer; forming a fifth insulation layer 113 on the pattern of the touch electrode 112, and patterning the fifth insulation layer 113 to form a fifth insulation pattern; and forming a pattern of a pixel electrode 114 on the fifth insulation pattern.

In the in-cell touch panel formed in the embodiment, the active layer 103 is electrically connected with the source electrode 109 by a first insulation layer via hole 010, the drain electrode 110 is electrically connected with the active layer 103 by a second insulation layer via hole 020, the touch electrode 112 is electrically connected with the touch line 107 by a third insulation layer via hole 030, and the pixel electrode 114 is electrically connected with the drain electrode 110 by a fourth insulation layer via hole 040. The touch line 107 and the data line 108 extend along a same direction, and the touch line 107 is at least partially overlapped with the data line 108 in a direction perpendicular to the base substrate; alternatively, the touch line 107 and the gate line 115 extend along a same direction, and the touch line 107 is at least partially overlapped with the gate line 115 in a direction perpendicular to the base substrate 100.

Figure 9:
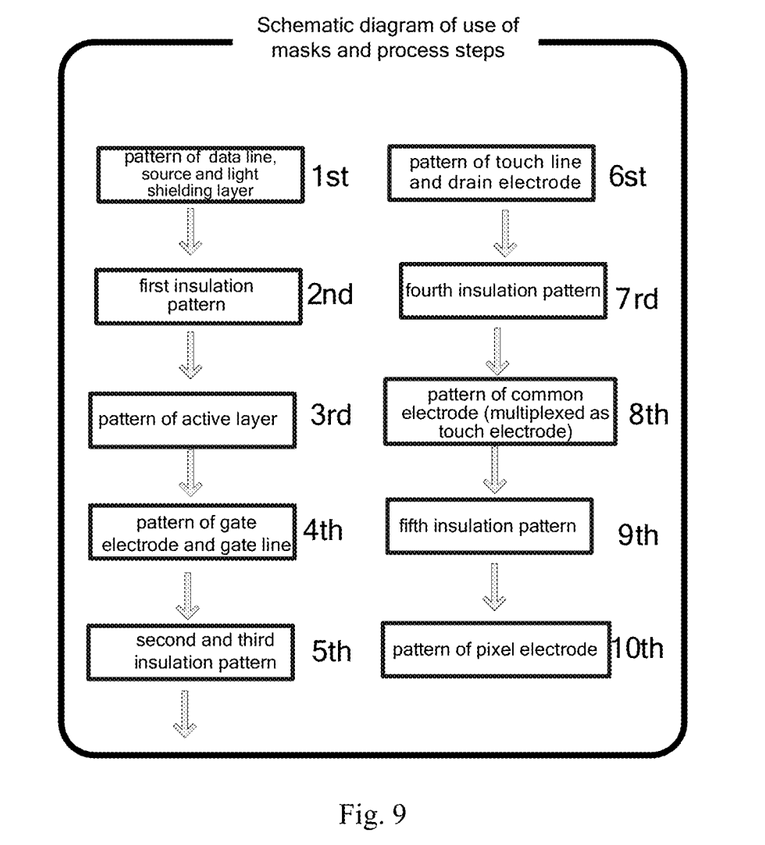
FIG. 9 is a schematic diagram of a manufacturing method of an in-cell touch panel provided by an embodiment of the disclosure.

In one example, the second insulation layer via hole 020 passing through the second insulation layer and the third insulation layer can be formed by adopting a same mask by one time patterning process. As illustrated in FIG. 9, ten masks are totally adopted. In a low temperature poly-silicon (LTPS) as an active layer and top gate structure mode, LS metal layer is served as a light shielding layer 101 of a thin film transistor (TFT), and it is also configured to transmit data signals at the same time. In this process, a mask to form the first insulation pattern is required to add. The drain electrode layer serves as a conduction layer of the TFT of a pixel, and it transmits touch signals at the same time, thereby implementing effectively conduction between the touch signals and respective independent touch electrodes 112. Conduction of the active layer—the drain electrode—the pixel electrode is implemented by the second insulation layer via hole 020 and the fourth insulation layer via hole 040, and the touch line is formed in a same layer as the drain electrode at the same time, thereby implementing wirings of touch function. The common electrode is conducted with the common electrode line by the third insulation layer via hole 030, and the common electrode serves as the self-capacitance touch electrode at the same time, thereby implementing touch of self-capacitance touch function. Process of manufacturing of the in-cell touch panel is implemented simply, and pixel aperture ratio will not be lost at the same time. It is an ideal structured optimized solution of the self-capacitance touch module.

At least one embodiment of the disclosure provides a display device including any of above mentioned in-cell touch panels.

One embodiment of the disclosure provides a self-capacitance in-cell touch panel and a display device. In the LTPS and top gate structure, the data line/source electrode layer which is in a same layer as the LS (light Shielding) layer 101 serves as a conduction layer of data signals at the same time, the touch line which is in a same layer as the drain layer serves as a conduction layer of the touch signals, the common electrode layer is multiplexed as the self-capacitance electrode by using principle of self-capacitance, the pattern of the common electrode layer is divided into a plurality of capacitance electrodes which are mutually independent, and the self-capacitance touch panel function is implemented by conducting the touch signals of the touch line in a same layer as the drain electrode to the common electrode 118, A solution of the in-cell touch panel would not affect the pixel aperture ratio, which can ensure the touch panel has a maximum aperture ratio; a signal transmission manner implemented by directly conducting the touch line 107 which is formed at the same time with the drain electrode in a same layer and the common electrode 118, would not introduce a new process for manufacturing an added touch metal layer.

In addition to self-capacitance electrodes, embodiments of the disclosure can also apply to mutual-capacitance electrodes. For example, in one embodiment, the first touch electrode is formed in a same layer as the LS, and the second touch electrode is formed in a same layer as the drain electrode 110. For example, the first touch electrode includes a plurality of first touch strips which are parallel with each other, the second touch electrodes includes a plurality of second touch strips which are parallel with each other, and the first touch strips are intersected with the second touch strips. Meanwhile, the first touch strips are insulated from the second touch strip. Thus, one of the first touch electrode and the second touch electrode can serve as the touch drive electrode, and the other serves as the touch sense electrode.

A mutual-capacitance touch panel includes a group of transverse electrodes and a group of longitudinal electrodes made of conductive material on the substrate (one of the group of the transverse electrodes and the group of the longitudinal electrodes serves as the touch drive electrode, and the other serves as the touch sense electrode), and a capacitor will be formed at a position where the two groups of electrodes are intersected with each other. When a finger touches a capacitance panel, coupling of two electrodes near the touch point will be affected, to change capacitance between the two electrodes. The touch detection chip decides the touch position by detecting such change of the capacitance value.

In embodiments of the disclosure, the light shielding layer 101, the gate electrode 105, the source electrode 109, the drain electrode 110, the touch line 107 can adopt metal material, for example, including: metal such as elementary substance of aluminum, copper, molybdenum, titanium, silver, gold, tantalum, tungsten or chromium, or an alloy of aluminum. For example, in order to further decrease resistance, Ti/Al/Ti metal material can be adopted, but it is not limited to this. The touch electrode 112 can adopt transparent conductive material (for example, ITO), but it is not limited to this. The active layer 103 can adopt polycrystalline silicon, amorphous silicon, etc., but it is not limited to this. The fourth insulation layer 111 can adopt organic insulation layer, and material of the organic insulation layer includes acrylic resin or polyimide resin. A material of the first insulation layer 102, the second insulation layer 104, the third insulation layer 106 and the fifth insulation layer 113 includes at least one selected from the group consisting SiNx, SiOx, and SiNxOy. It should be noted that, what is mentioned above are only examples, but it does not tend to limit. Other materials also can be adopted, and it is not limited by the embodiments of the disclosure.

In the embodiments of the disclosure, "same layer" refers to a layer structure formed by forming a film layer for forming a predetermined pattern by adopting a same film forming process and then using a same mask by one time patterning process. According to different predetermined patterns, one time patterning process may include a plurality of times of exposure, development or etching process, and the predetermined pattern formed in the layer structure can be continuous or non-continuous. The predetermined patterns may be positioned in different height or have different thicknesses.

The following statements should be noted:

(1) Unless otherwise defined, a same reference numeral represents a same meaning in the embodiments of the disclosure and accompanying drawings.

(2) The accompanying drawings involve only the structure(s) in connection with the embodiment(s) of the present disclosure, and other structure(s) can be referred to common design(s). In addition, respective components are not limited to shapes illustrated in figures.

(3) For the purpose of clarity only, in accompanying drawings for illustrating the embodiment(s) of the present disclosure, the thickness of a layer or a region may be enlarged. However, it should understood that, in the case in which a component or element such as a layer, film, area, substrate or the like is referred to be "on" or "under" another component or element, it may be directly on or under the another component or element or a component or element is interposed there between.

(4) In case of no conflict, features in different embodiments or in one embodiment can be combined.

What are described above is the embodiments of the disclosure only and not limitative to the scope of the disclosure; any of those skilled in related arts can easily conceive variations and substitutions in the technical scopes disclosed by the disclosure, which are encompassed in protection scopes of the disclosure. Therefore, the scopes of the disclosure should be defined in the appended claims.

The application claims priority to the Chinese patent application No. 201610493669.8, filed Jun. 28, 2016, the entire disclosure of which is incorporated herein by reference as part of the present application.

The invention claimed is:

1. An in-cell touch panel, comprising a base substrate, and a signal line, a touch electrode and a touch line which are provided on the base substrate, the touch line being electrically connected with the touch electrode, wherein the touch line and the signal line extend along a same direction, and the touch line is at least partially overlapped with the signal line in a direction perpendicular to the base substrate,
   wherein the in-cell touch panel further comprises a thin film transistor, the thin film transistor comprises an active layer, a source electrode and a drain electrode, the active layer are electrically connected with the source electrode and the drain electrode, respectively;
   wherein the source electrode is located on a first side of the active layer facing the base substrate, and the drain electrode is located on a second side of the active layer facing away from the base substrate; and
   wherein the touch line and the source electrode are located on opposite sides of the active layer which are the first side and the second side, respectively.

2. The in-cell touch panel according to claim 1, wherein the touch line is entirely overlapped with the signal line in the direction perpendicular to the base substrate.

3. The in-cell touch panel according to claim 1, wherein the signal line comprises a data line or a gate line.

4. The in-cell touch panel according to claim 3, wherein the source electrode and the data line are electrically connected with each other and are formed in a same layer, and the touch line and the drain electrode are formed in a same layer.

5. The in-cell touch panel according to claim 4, wherein the thin film transistor further comprises a gate electrode, wherein the gate line is electrically connected with the gate electrode, the gate line and the gate electrode are formed in a same layer, and the active layer is provided between the gate electrode and the base substrate.

6. The in-cell touch panel according to claim 5, further comprising a light shielding layer, wherein the data line, the source electrode and the light shielding layer are formed in a same layer, and the light shielding layer is provided between the active layer and the base substrate.

7. The in-cell touch panel according to claim 1, further comprising a pixel electrode, wherein the pixel electrode is electrically connected with the drain electrode.

8. The in-cell touch panel according to claim 1, wherein the touch electrode is multiplexed as a common electrode, and the touch line is multiplexed as a common electrode line.

9. The in-cell touch panel according to claim 1, wherein the touch electrode corresponds to a sub-pixel or a plurality of sub-pixels.

10. The in-cell touch panel according to claim 1, wherein the signal line is electrically insulated from the touch electrode, and the signal line is electrically insulated from the touch line.

11. A display device, comprising the in-cell touch panel according to claim 1.

12. A manufacturing method of an in-cell touch panel, comprising:
   forming a pattern of a data line, a source electrode and a light shielding layer on a base substrate by one time patterning process;
   forming a first insulation layer on the pattern of the data line, the source electrode and the light shielding layer;
   forming a pattern of an active layer on the first insulation layer, the active layer being electrically connected with the source electrode by a first insulation layer via hole;
   forming a second insulation layer on the pattern of the active layer;
   forming a pattern of a gate electrode and a gate line on the second insulation layer by one time patterning process;
   forming a third insulation layer on the pattern of the gate electrode and the gate line;
   forming a pattern of a touch line and a drain electrode on the third insulation layer by one time patterning process, the drain electrode being electrically connected with the active layer by a second insulation layer via hole;
   forming a fourth insulation layer on the pattern of the touch line and the drain electrode; and
   forming a pattern of a touch electrode on the fourth insulation layer, the touch electrode being electrically connected with the touch line by a third insulation layer via hole;
   wherein the touch line and the data line extend along a same direction, and the touch line is at least partially overlapped with the data line in a direction perpendicular to the base substrate, or the touch line and the gate line extend along a same direction, and the touch line is at least partially overlapped with the gate line in a direction perpendicular to the base substrate,
   wherein the source electrode is located on a first side of the active layer facing the base substrate, and the drain electrode is located on a second side of the active layer facing away from the base substrate; and
   wherein the touch line and the source electrode are located on opposite sides of the active layer which are the first side and the second side, respectively.

13. The manufacturing method of the in-cell touch panel according to claim 12, wherein the touch line is entirely overlapped with the data line in the direction perpendicular to the base substrate; or, the touch line is entirely overlapped with the gate line in the direction perpendicular to the base substrate.

14. The manufacturing method of the in-cell touch panel according to claim 12, further comprising forming a pattern of a pixel electrode, wherein the pixel electrode is electrically connected with the drain electrode by a fourth insulation layer via hole.

15. The manufacturing method of the in-cell touch panel according to claim 12, wherein the touch electrode is multiplexed as a common electrode, and the touch line is multiplexed as a common electrode line.

16. The manufacturing method of the in-cell touch panel according to claim 13, further comprising forming a pattern of a pixel electrode, wherein the pixel electrode is electrically connected with the drain electrode by a fourth insulation layer via hole.

17. The manufacturing method of the in-cell touch panel according to claim 13, wherein the touch electrode is multiplexed as a common electrode, and the touch line is multiplexed as a common electrode line.

18. An in-cell touch panel, comprising a base substrate, and a signal line, a touch electrode and a touch line which are provided on the base substrate, the touch line being electrically connected with the touch electrode, wherein the touch line and the signal line extend along a same direction, and the touch line is at least partially overlapped with the signal line in a direction perpendicular to the base substrate, wherein the in-cell touch panel further comprises a thin film transistor, wherein the thin film transistor comprises an active layer, a source electrode and a drain electrode, the active layer are electrically connected with the source electrode and the drain electrode, respectively; and the source electrode is provided between the active layer and the base substrate, wherein the source electrode and the drain electrode are located on opposite sides of the active layer which are a first side of the active layer facing the base substrate and a second side of the active layer facing away from the base substrate, respectively; and wherein the touch line and the source electrode are located on opposite sides of the active layer which are the first side and the second side, respectively.

* * * * *